United States Patent [19]
Hvistendahl

[11] Patent Number: 5,600,160
[45] Date of Patent: Feb. 4, 1997

[54] MULTICHANNEL FIELD EFFECT DEVICE

[76] Inventor: Douglas D. Hvistendahl, P.O. Box 216, Ellendale, N. Dak. 58436

[21] Appl. No.: 376,064

[22] Filed: Jan. 20, 1995

Related U.S. Application Data

[63] Continuation of Ser. No. 47,693, Apr. 14, 1993, abandoned.

[51] Int. Cl.⁶ .................................................. H01L 29/76
[52] U.S. Cl. ..................... 257/288; 257/368; 257/272; 257/133; 257/107
[58] Field of Search ................................. 257/288, 107, 257/109, 133, 124, 126, 141, 167, 150, 153, 162, 368

[56] References Cited

U.S. PATENT DOCUMENTS

| | | | |
|---|---|---|---|
| 3,584,270 | 6/1971 | Philips | 317/235 |
| 4,064,494 | 12/1977 | Dickson et al. | 365/49 |
| 4,199,774 | 4/1980 | Plummer | 357/41 |
| 4,377,855 | 3/1983 | Lavi | 365/49 |
| 4,574,209 | 3/1986 | Lade et al. | 307/577 |
| 4,631,561 | 12/1986 | Foroni et al. | 357/13 |
| 4,794,441 | 12/1988 | Sugawara et al. | 257/124 |
| 4,827,321 | 5/1989 | Baliga | 357/37 |
| 4,831,585 | 5/1989 | Wade et al. | 365/49 |
| 4,947,226 | 8/1990 | Huang et al. | 357/38 |
| 4,967,255 | 10/1990 | Bauer et al. | 357/37 |

FOREIGN PATENT DOCUMENTS

| | | |
|---|---|---|
| 52-5259 | 6/1977 | Japan . |
| 1-253274 | 10/1989 | Japan . |

OTHER PUBLICATIONS

"Insulated–Gate Planar Thyristors: II–Quantitive Modeling" by Brad W. Scharf et al., IEEE Transactions on Electron Devices, vol. Ed–27, No. 2, Feb. 1980.

"MOS–Controlled Thyristors–A New Class of Power Devices" by Victor A. K. Temple, IEEE Transactions on Electron Devices, vol. Ed–33, No. 10, Oct. 1986.

"Insulated–Gate Planar Thyristors: I–Structure and Basic Operation" by James D. Plummer et al., IEEE Transactions on Electron Devices, vol. Ed–27, No. 2, Feb. 1980.

*Primary Examiner*—Jerome Jackson, Jr.
*Assistant Examiner*—Nathan Kelley
*Attorney, Agent, or Firm*—Westman, Champlin & Kelly, P.A.

[57] ABSTRACT

A dual channel field-effect switching device is disclosed. The switching device includes two adjacent semiconductor regions of opposite polarity forming a PN junction therebetween. A gate structure overlying the semiconductor regions controls the presence of two electrically isolated conductive channels formed in selected portions of the semiconductor regions.

20 Claims, 7 Drawing Sheets

MULTICHANNEL FIELD EFFECT DEVICE

This is a Continuation of application Ser. No. 08/047,693, filed Apr. 14, 1993, abandoned.

BACKGROUND OF THE INVENTION

The present invention relates to semiconductor devices and, more particularly, to a five-terminal device with a dual channel structure having the function of a switching apparatus.

Numerous four layer semiconductor devices are commonly known in the art. These devices consist of four layers of semiconductor doped alternately with P-type and N-type impurities. Such devices include diodes, thyristors or silicon-controlled rectifiers, and bi-directional switches (diac and triac structures). These devices commonly have an outer P-type region called the anode and an opposite terminal of N-type region called the cathode. Alternating layers of N-type materials and P-type material are interposed between these terminals. These devices can functionally be considered as a single pole switch in that when biased with an external voltage applied to make the anode. positive with respect to the cathode, and appropriately triggered, current flows from the anode to the cathode. In a four layer diode, triggering occurs when the applied voltage exceeds a predetermined level.

The thrysistor or silicon-controlled rectifier is triggered through a control line commonly called a gate. The gate is connected typically to the inner P-type doped region and when a positive pulse is applied to the gate, regenerative action occurs within the device allowing current to flow from the anode to the cathode. In high-power thyristors, once the device is in the ON state, the gate circuit has little effect on the operation. However, in low-power thyristors, the gate circuit can be used to turn the device both on and off. Typically, a negative current is usually required to turn the device off.

Field-effect devices such as MOSFETs are also used to control current flow through a circuit. Briefly, an insulated gate is used to selectively control formation of a conductive channel between two terminals. In CMOS devices, two conductive channels of two transistor devices are alternately formed to connect the output to one of two other terminals. Essentially, the CMOS device comprises a PMOS transistor series connected to an NMOS transistor using the conductive material of the output terminal.

SUMMARY OF THE INVENTION

A dual channel field effect semiconductor switching device is disclosed. The semiconductor switching device includes a semiconductor body having a first region of semiconductive material doped to a first polarity type adjacent a second region of semiconductive material doped to a second polarity type forming a PN junction therebetween. An insulated gate structure receives a control signal and controls presence of a first conductivity channel in the first region when a first voltage level of the control signal is received, and controls presence of a second conductivity channel in the second region when a second voltage level of the control signal is received. The semiconductor regions can be suitably doped to operate either in depletion or enhancement mode.

In a first embodiment, the first region includes portions separated by a barrier, preferably an insulator, with a further portion used to form the first conductivity channel which selectively electrically connects the separated portions of the first region. The second region is further separated by the first region with the second conductivity channel selectively electrically connecting the separated portions of the second region. The second conductivity channel is formed in a portion interconnecting the separated portions of the second region and between the insulated gate structure and the location of the first conductivity channel. As such, the gate structure controls presence of the first conductivity channel through a portion of the second region of semiconductive material, the portion of the second region of semiconductive material being of suitable thickness to allow formation of the first conductivity channel. The first and second regions can be fabricated to make a lateral device or a vertical device.

In a second embodiment, the semiconductor body includes a third region of the first polarity and a fourth region of the second polarity. The third region is disposed adjacent to the second region, while the fourth region is disposed adjacent to the first region. The insulated gate structure controls presence of the first conductivity channel to electrically connect the second region to the fourth region. The insulated gate structure further controls presence of the second conductivity channel to electrically connect the first region to the third region.

In this embodiment, the first and second type of semiconductor regions are alternately positioned adjacent each other to form a four layer device with three PN junctions. The gate structure is located across two regions of opposite polarity to control presence of the conductivity channels formed therein.

The switching device of the second embodiment can be constructed as a lateral device. Specifically, each semiconductor region is formed in a substrate body or thermally grown thereon to construct a planar major lateral surface. Each semiconductor region intersects with the major surface to allow terminal contacts to be attached. When viewed sectionally, the switching device comprises two outer semiconductor regions of opposite polarity and two inner semiconductor regions of opposite polarity. The gate structure is positioned on the major surface overlying a portion of each of the inner semiconductor regions.

Alternatively, the switching device of the second embodiment can be constructed with vertical orientation. Each of the semiconductor regions are layered with alternating polarity to form the semiconductor body. A groove, well or similar cavity formed in the semiconductor is used to provide a suitable gate structure.

DETAILED DESCRIPTION OF THE PREFERRED EMBODIMENTS

Figure 1:
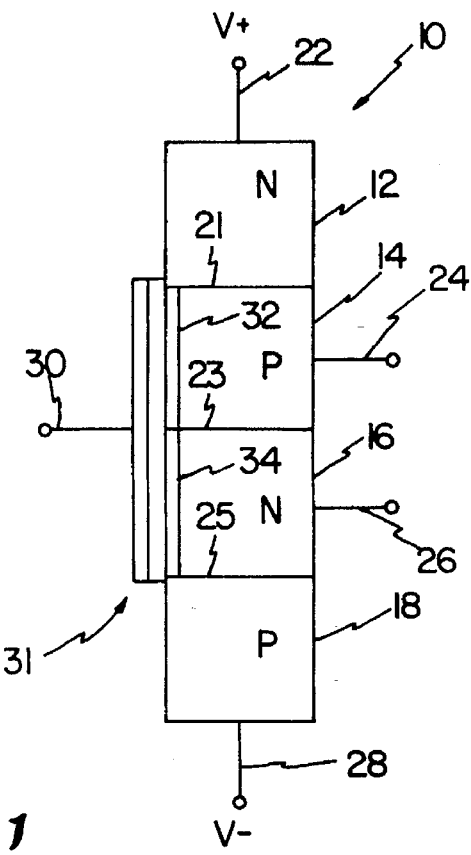
FIG. 1 is a schematic representation of the semiconductor switching device of the present invention.

A schematic representation of a two channel semiconductor field-effect switching device 10 of the present invention is illustrated in FIG. 1. Preferably, the switching device 10 is a four layer device having semiconductor material regions 12, 14, 16 and 18. Each semiconductor region is positioned adjacent to at least one oppositely doped region; therefore, the device 10 comprises two negatively doped regions 12 and 16, hereinafter "N-type" regions, and two positively doped regions 14 and 18, hereinafter "P-type" regions. Three PN junctions 21, 23 and 25 are formed as illustrated. Upon each of these semiconductor regions 12, 14, 16 and 18, a terminal 22, 24, 26 and 28 is connected, respectively. A gate terminal 30 connected to a field-effect gate structure 31 controls the presence of conductive channels indicated at 32 and 34 formed in the interior regions 14 and 16, respectively, thereby allowing selective electrical conductivity to be made between terminals 22 and 26 through region 14, and between 24 and 28 through region. 16, respectively. Buried insulators, not shown, can be disposed at the PN junctions 21, 23 and 25, if desired to isolate each of the semiconductor regions so long as the insulators do not interfere with channel formation. Generally, the switching device 10 functions similar to a double-pole, single-throw per channel, alternate "on" switch.

Figure 2:
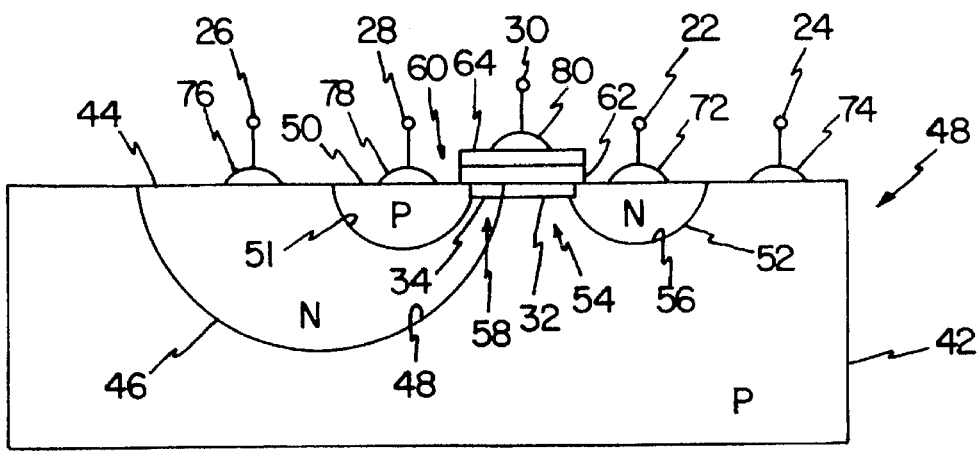
FIG. 2 is a representation of a first embodiment of the semiconductor switching device of the present invention.

Using conventional semiconductor fabrication techniques, the semiconductor switching device of the present invention can be formed laterally or vertically. Referring to FIG. 2, a lateral switching device 40 is illustrated. The switching device 40 is typically formed of doped silicon having boron distributed therein to provide a substrate 42 of P-type conductivity having an upper major surface 44. A region 46 of N-type conductivity is formed within the P-type substrate 42. Typically, the N-type region 46 is formed by ion implantation of phosphorous or arsenic ions into the P-type substrate 42 using conventional techniques. This results in a semiconductor PN junction separating each of the oppositely doped regions 42 and 46 along a periphery surface boundary 48 that intersects the major surface 44.

A second region of P-type semiconductive material 50 is formed in the N-type region 46 to intersect with the major surface 44, forming a second PN junction 51 therebetween. The P-type region 50 can be formed conventionally by ion implanting boron ions as is well known in the art.

A second N-type region 52 typically formed by ion implantation of phosphorous or arsenic ions is made in the P-substrate 42 having a portion 54 of the P-type substrate 42 separating the N-type regions 46 and 52. The N-type region 52 intersects with the major surface 44 and together with P-type regions 42 forms a third PN junction 56.

A gate structure 60 is applied to a portion of the major surface 44 to overlie the portion 54 of P-type region 42 and a portion 58 of N-type region 46. The gate 60 includes an electrically insulating layer 62, typically formed primarily of silicon dioxide and attached to the major surface 44. A gate plate 64, typically formed of polysilicon which has been doped with phosphorous to provide low resistivity, is joined to the insulating layer 62 on a surface opposite the major surface 44. As illustrated, the insulating layer 62 and gate plate 64 are positioned with slight overlap onto regions 50 and 52. If desired, the ends of insulating layer 62 and gate plate 64 can coincide with the boundary edges 51 and 56.

An ohmic contact is provided for each of the semiconductor regions. As illustrated, a first ohmic contact 72 is connected to the N-.type region 52. A second ohmic contact 74 is connected to the P-type region 42. A third ohmic contact 76 is connected to the N-type region 46, while a fourth ohmic contact 78 is connected to the P-type region 50. The gate structure 60 further includes an ohmic contact 80 attached to plate 64. The ohmic contacts 72, 74, 76 and 78 are electrically connected to terminals 22, 24, 26 and 28, respectively. The ohmic contact 80 is electrically connected to the gate terminal 30. The ohmic contacts 72, 74, 76, 78 and 80 are usually provided by metal deposition.

Referring back to FIG. 1, the N-type region 52 corresponds to region 12; the P-type region 42 corresponds to region 14; the N-type region 46 corresponds to region 16; and the P-type region 50 corresponds to region 18. The N-type conductivity channel 32 is formed in P-type portion 54, while, the P-type conductivity channel 34 is formed in the N-type portion 58.

FIG. 1 further illustrates biasing for proper operation. Generally, the switching device is biased to prevent a parasitic circuit from being formed. A parasitic circuit develops when a voltage applied to any N-type region is more than a diode drop below a voltage applied to an adjacent P-type region. In this situation, the PN junction formed therebetween is forward biased and current will conduct in a manner similar to that of a diode. In contrast, to avoid parasitic circuits each PN junction is reversed biased wherein the N-type regions are biased with a voltage at least one diode drop greater than the P-type regions. FIG. 1 illustrates biasing wherein a positive voltage is applied to N-type region 12 and a negative voltage is applied to P-type region 18. This biasing arrangement is opposite to that of a conventional thyristor wherein the P-type region receives a positive voltage and the N-type region receives a negative voltage. In other embodiments, the positive voltage can be applied to the region 16, or a negative voltage can be applied to the region 14. The present invention can also be used when each of the bias and voltages are of different magnitudes if the biasing voltages are applied so that each of the PN junctions are reversed biased. Normal conduction of this device is through "on" channels.

The switching device of FIGS. 1 and 2 is a field-effect device in that the conductive channels 32 and 34 are controlled by application of a control voltage to the gate terminal 30. Traditionally, field-effect devices have a source terminal, a drain terminal and a gate terminal wherein control voltage applied to the gate terminal and referenced to the source terminal controls conduction between the source terminal and the drain terminal. Using this terminology and referring to FIG. 1, the switching device 10 of the present invention has two source terminals 24 and 26, and two drain terminals 22 and 28 with the single gate terminal 30 controlling two conductive channels 32 and 34 formed between the source terminal 26 and the drain terminal 22, and the source terminal 24 and the drain terminal 28, respectively. As with other field effect devices, reference to "source" and "drain" terminals are used for convenience in that they are interchangeable. Strictly speaking, source and drain denotations are made only after the biasing voltages have been applied.

The switching device 10 may be designed either to operate as an enhancement-mode device or a depletion-mode device. An enhancement-mode device is defined where a gate-source voltage of the same polarity as the drain-source voltage (positive for an N-conductivity channel, and negative for a P-conductivity channel) is required to initiate substantial conduction between the source and drain. In other words, a device that has no conducting channel at zero gate-source voltage is termed a normally-off or an enhancement-mode device. In contrast, a device which is normally-on at zero gate-source voltage bias is termed a depletion-mode device. For an N-conductivity channel depletion device, negative gate-source voltage depletes the conducting channel, whereas in a P-conductivity channel depletion device, a positive gate-source voltage depletes the conducting channel. Threshold voltages, or the voltage value that controls enhancement and depletion of the conducting channel, are commonly denoted, $V_{TE}$ and $V_{TD}$, respectively. The threshold voltage, $V_{TE}$, is the voltage in which there exists substantial current flow through the conductive channel. Whereas, the threshold voltage, $V_{TD}$, is the voltage in which substantial current flow through the conductive channel is inhibited.

Figure 4:
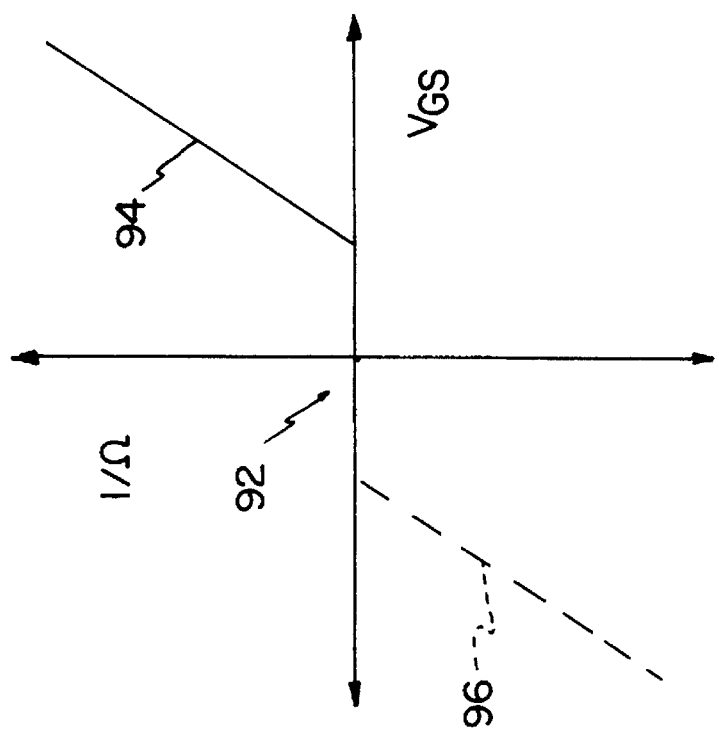
FIGS. 3–7 are transconductance characteristics of the semiconductor switching device of the present invention.
Figure 3:
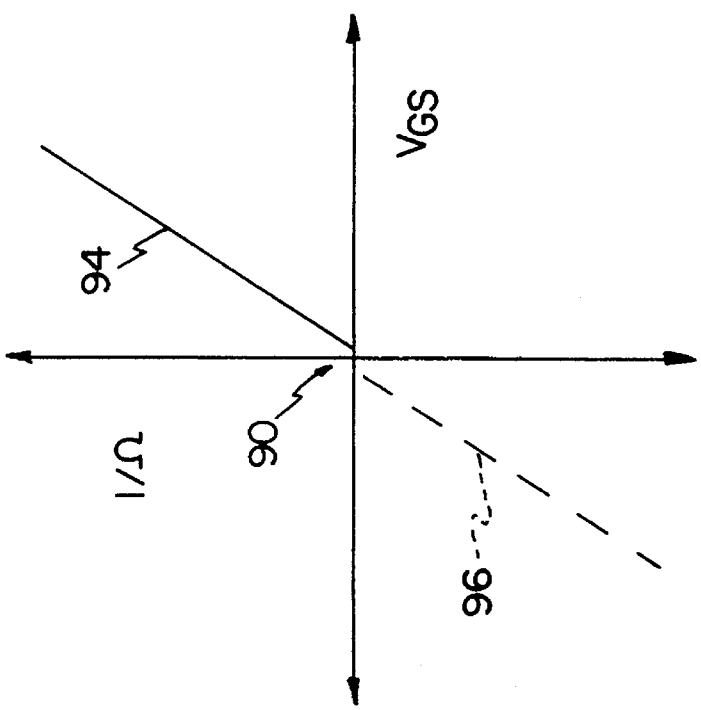

FIGS. 3 through 7 illustrate transconductance characteristics of the switching device 10 shown schematically in FIGS. 1, or embodied as a lateral device 40 shown in FIG. 2, for enhancement and depletion doping configurations. In FIGS. 3 and 4, the transconductance of the conductivity channels 32 and 34 are represented wherein a solid line 94 is used to represent the conductance of the N-type conductivity channel 32 formed in the region 14, while a dashed line 92 is used to represent the conductance of the P-type channel 34 formed in the region 16. Throughout the Figures, the vertical axis represents conductance, while the horizontal axis represents applied gate-source voltage. The transconductance curves illustrated in these figures are estimates based on standard field-effect operating principles.

FIGS. 3 and 4 illustrate a device of the present invention wherein both channels are sufficiently doped to operate in enhancement mode. FIG. 3 illustrates a device wherein threshold turn-on voltages between the gate-source terminal pairs are sufficiently close to each other to provide a very narrow "dead band" 90. In contrast, FIG. 4 illustrates a device wherein voltage differences between the threshold turn-on voltages for the gate-source terminal pairs define a larger dead band area 92. In either case, when a sufficient positive voltage is applied to the gate terminal 30, an N-type conductivity channel 32 is created in the P-type region 14 between the two N-type regions 12 and 16 allowing conduction or current between the corresponding source and drain terminals 22 and 26 generally following the transconductance characteristic curve 94. In contrast, when a sufficient negative gate voltage is applied to the gate terminal 30, a P-type conductivity channel 34 is created in the N-type region 16 between the two P-type regions 14 and 18 with conduction between the source and drain terminals 24 and 28 generally following the transconductance characteristic curve 96. The dead band occurs because in this embodiment it is not possible for both channels to conduct at the same time.

Figure 7:
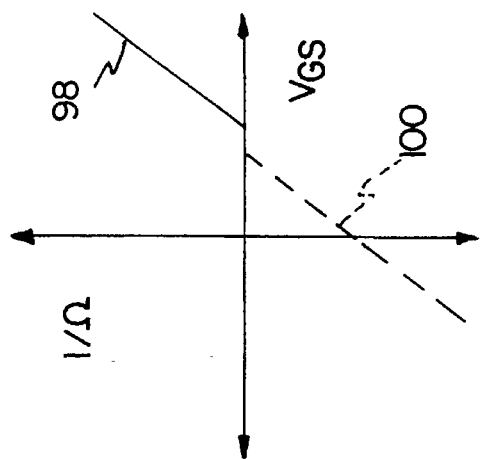
Figure 6:
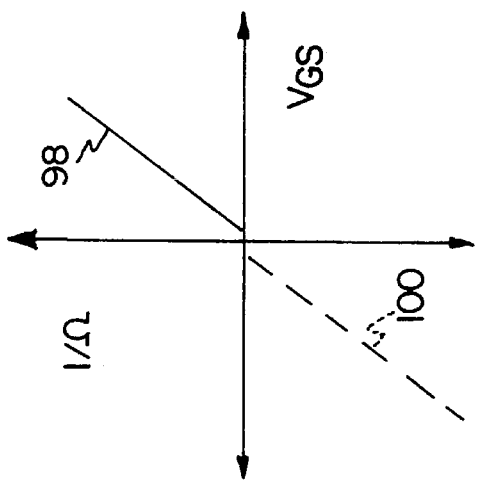
Figure 5:
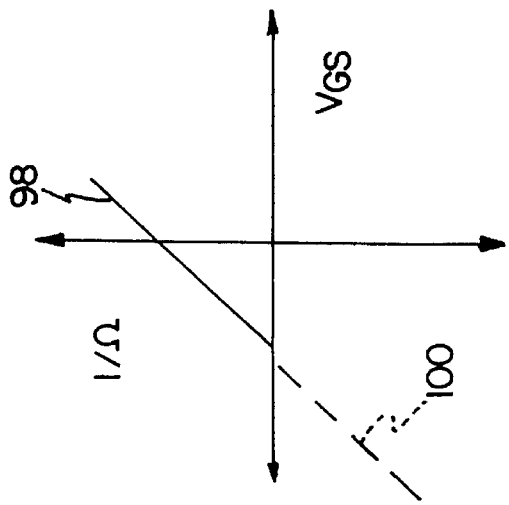

FIGS. 5–7 illustrate devices made according to the present invention wherein one or more regions is sufficiently doped to form a conductive channel as found in a depletion mode device. The transconductance of the conductivity channels 32 and 34 are represented wherein a solid line 98 is used to represent the conductance of the N-type conductivity channel 32 formed in the region 14, while a dashed line 100 is used to represent the conductance of the P-type channel 34 formed in the region 16.

By making the surface layers under the gate normally conductive, normally on-type switches can be simulated between each of the terminal pairs 22 and 26, and, 24 and 28. When a sufficient positive gate voltage is applied to the gate terminal 30, the P-type channel 34 is eliminated leaving only the N-type channel 32 as a conductive path between the regions 12 and 16. In similar fashion, when a sufficient negative voltage is applied to the gate terminal, the N-type channel 32 is eliminated leaving only the P-channel 34 as a conductive path between the regions 14 and 18. FIG. 5 illustrates a device wherein the N-type channel is dominant, while FIG. 7 illustrates a device wherein the P-type channel is dominant. Reference is further made to FIG. 6 to illustrate a device wherein neither channel is dominant. It is to be understood that substrate biasing voltage, if varied, will shift the transconductance curves described above.

A benefit of this embodiment of the present invention is that the two conducting channels mutually isolate each other during conductance of the other. Referring to FIG. 1, if both conductance channels 32 and 34 were doped for depletion mode operation, a gate voltage can be applied to balance the possible conduction channel formations. When the gate voltage potential is changed such that one of the channels is depleted, the polarity-type regions opposite to the conducting channel are isolated, neglecting effects in the third dimension.

Figure 8:
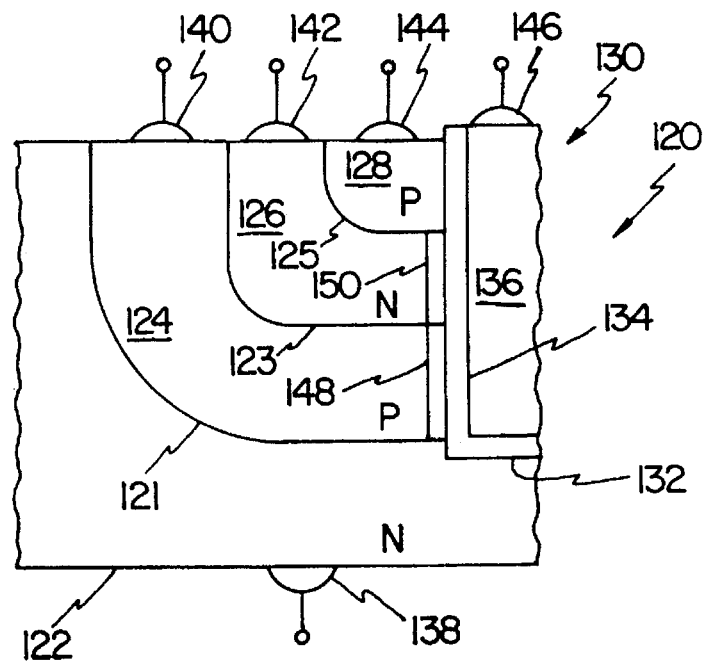
FIG. 8 is a representation of a second embodiment of the semiconductor switching device of the present invention.
Figure 9:
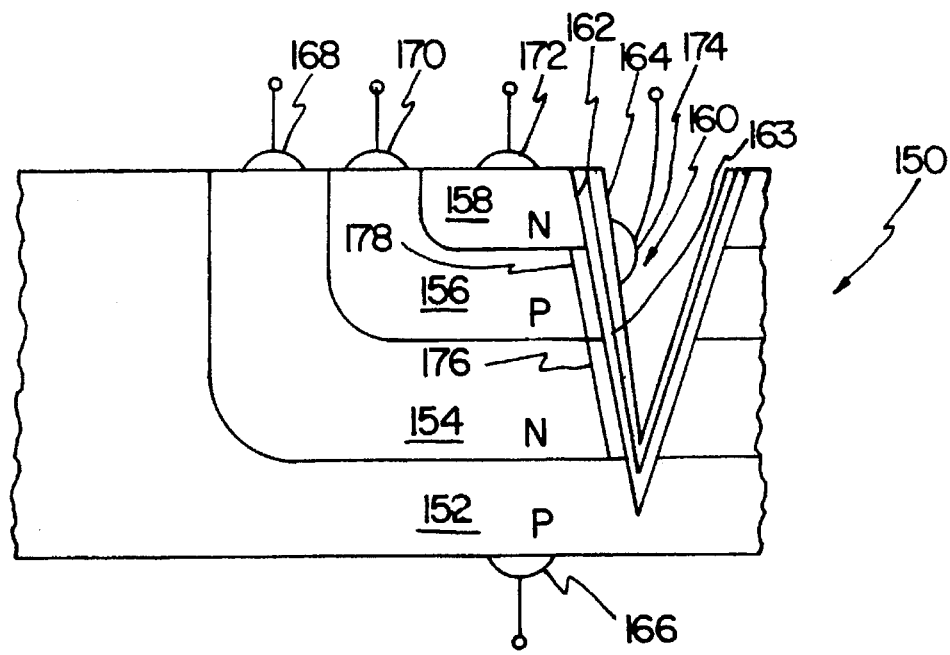
FIG. 9 is a representation of a third embodiment of the semiconductor switching device of the present invention.

FIGS. 8 and 9 illustrate other embodiments in accordance with the present invention operating according to the estimated transconductance characteristics described above and illustrated in FIGS. 3–7. FIG. 8 is a representation of another device 120 in accordance with the present invention which also functions as a gate controlled two channel semiconductor switching device. The switching device 120 is vertically constructed having a N-type substrate 122. Alternating regions of P-type polarity 124, N-type polarity 126 and P-type polarity 128 are thermally grown on substrate 122 or diffused in an adjacent region using conventional techniques. The substrate 122 and regions 124, 126 and 128 thus form a semiconductor block. Like the lateral embodiment described above, the switching device 120 includes three PN junctions 121, 123 and 125. A well-type gate structure 130 is formed using conventional techniques such as anisotropic silicon etching to form a well 132 through the regions 124, 126 and 128 to the substrate layer 122. An oxide layer 134 is thermally grown or deposited in the well 132 and a gate plate 136 is formed thereover. Ohmic contacts 138, 140, 142 and 144 are made to each of the regions 122, 124, 126 and 128, respectively, and a contact 146 is connected to the gate plate 136. The device 120 functions similar to that described above wherein conducting channels 148 and 150 are formed in the regions 124 and 126 when suitable control voltages are applied to the gate 130.

FIG. 9 is a representation of another device 150 in accordance with the present invention which also functions as a gate controlled two channel semi conductor switching device. The device 150 is similar to the device 120 of FIG. 8 in that current flows vertically; however, a P-type substrate 152 with alternating polarity regions of N-type 154, P-type 156 and N-type 158, and a V-groove gate structure 160 is employed. Anisotropic silicon etching is used to form a V-groove 162 through the regions 154, 156 and 158. An oxide layer 163 is thermally grown or deposited in the V-groove 162 and gate plate 164 is formed thereover. Ohmic contacts 166, 168, 170 and 172 are made to each of the regions 152, 154, 156, and 158, respectively, and a contact 174 is connected to the gate plate 164. The device 150 functions similar to that described above wherein conducting channels 176 and 178 are formed in the regions 154 and 156 when suitable control voltages are applied to the gate 160.

Figure 10:
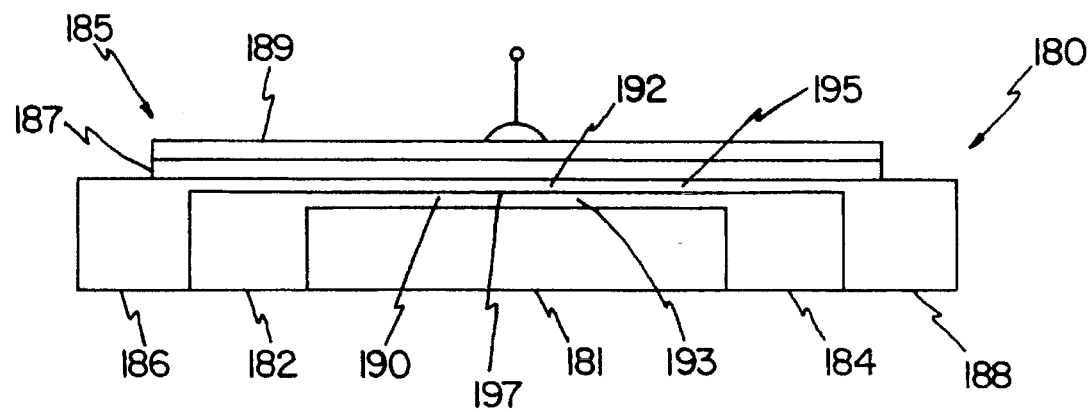
FIG. 10 is a representation of a fourth embodiment of the semiconductor switching device of the present invention.

FIG. 10 is a representation of another device 180 in accordance with the present invention which also functions as a gate controlled two channel semiconductor switching device. In this embodiment, the semiconductor regions are positioned with like semiconductor material on opposed sides of a buried barrier, preferably an insulator 181. As illustrated, semiconductor regions 182 and 184 are of P-type polarity. Adjacent each of these semiconductor regions are positioned regions 186 and 188 of N-type polarity. Suitable terminal contacts, not shown, are provided for each of the semiconductor regions.

Conductive channels 190 and 192 formed in suitable semiconductor layers 193 and 195, respectively, selectively electrically join the regions of same polarity. As illustrated, conductive channel 190 is positioned directly above buried insulator 181 to electrically connect regions 182 and 184. The conductive channel 192 is positioned above the conductive channel 190 to electrically connect regions 186 and 188. The layers 193 and 195 form a PN junction 197 therebetween.

A gate structure 185 comprising a suitable insulator layer 187 and gate plate 189 is positioned above the conductive channel 192. The gate structure 185 receives a control signal to selectively control formation of either of the conductive channels 190 or 192. It should be understood that the thickness of the conductive channel 192 allows for modulation of the conductive channel 190 therethrough. Like the embodiments described above, the conductive channels 190 and 192 can be sufficiently doped to operate with either enhancement or depletion mode characteristics. However, unlike the embodiments described above, the conductive channels 190 and 192 can be sufficiently doped to operate in depletion mode with both channels conducting for control voltages corresponding to the dead band region. Although illustrated as a lateral device, this embodiment can be made with vertical orientation.

The switching device of the present invention is implemented in circuits to provide a number of common logic functions. To facilitate understanding, reference hereinafter will be made to the electrical symbol 250 illustrated in FIG. 11, which will be used to represent the switching device of the present invention. With reference to the schematic representation illustrated in FIG. 1, the symbol 250 includes five leads 22, 24, 26, 28 and 30 wherein the same reference indicators have been used to identify the different semiconductor regions. An inward arrowhead is provided on the terminal lead 24 to represent the P-type region 14 within which the N-type conductivity channel is formed between the regions 12 and 16, while an outward arrowhead is provided on the terminal lead 26 to represent N-type region 16 within which the P-type conductivity channel is formed between the regions 14 and 18.

Figure 11:
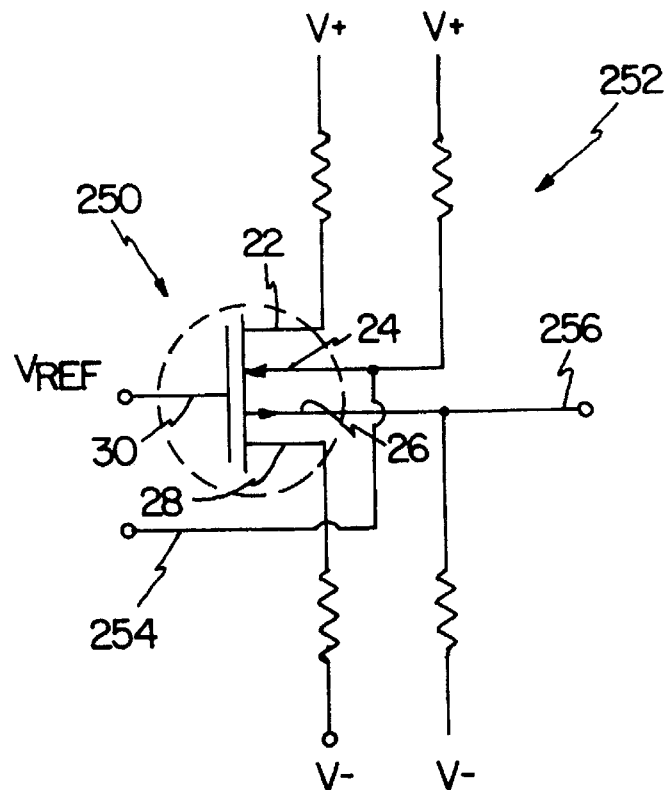
FIG. 11 is an inverter circuit using the switching device of the present invention.

The switching device 250 of FIG. 11 is biased and connected to provide an inverter 252. Using a switching device having transconductance characteristics similar to FIGS. 3 or 5–7, or in other words, a switching device wherein conductive channel formation occurs sharply with no or minimal dead band, and a physical structure like that illustrated in FIGS. 2, 8 or 9 where two conductivity channels can not both be present, a voltage $V_{ref}$ is applied to the gate terminal 30 to form either the N-type conductivity channel or the P-type conductivity channel. Each of the semi-conductivity regions are connected to biasing voltages $V^+$ or $V^-$ in complimentary pairs. Specifically, a positive voltage is applied to one of the N-type regions and a negative voltage is applied to the other N-type region. Similarly, a positive voltage is applied to one of the P-type regions and a negative voltage is applied to the other P-type regions. Biasing resisters are provided as current limiters, but could be replaced with suitable transistors, switches or the like.

The inverter 252 operates by controlling formation of one of the conductive channels in switching device 250, which in turn will prevent or allow conductance along the path of the other conductivity channel. An input terminal 254 is connected to terminal lead 24, while an output terminal 256 is connected to terminal lead 26. As stated above, a suitable voltage is applied to the gate terminal 30 to form either a conductive channel between the terminals 22 and 26 or the terminals 24 and 28. Since channel formation in the region 14 is controlled by a voltage difference between the terminal 14 and the gate terminal 30, selective channel formation can be controlled by varying the voltage applied to the terminal 24. As illustrated in FIG. 11, lowering the voltage on the input signal line cuts off the P-type conductivity channel, allowing an N-type conductivity channel. This allows current to flow through the N-type conductivity channel and between terminals 22 and 26 subsequently raising the voltage on the output signal line 256. In contrast, raising the voltage on the input signal line 254 cuts off the N-type conductivity channel by allowing the P-type conductivity channel to form. Current then flows through the P-type conductivity channel and between terminals 24 and 28 thereby lowering the voltage on the output signal line 256 since the N-type conductivity channel is severed. Other functions can be implemented with different terminal connections. For instance, if the output signal line 256 is connected to terminal 22, a voltage follower function is realized.

Figure 12:
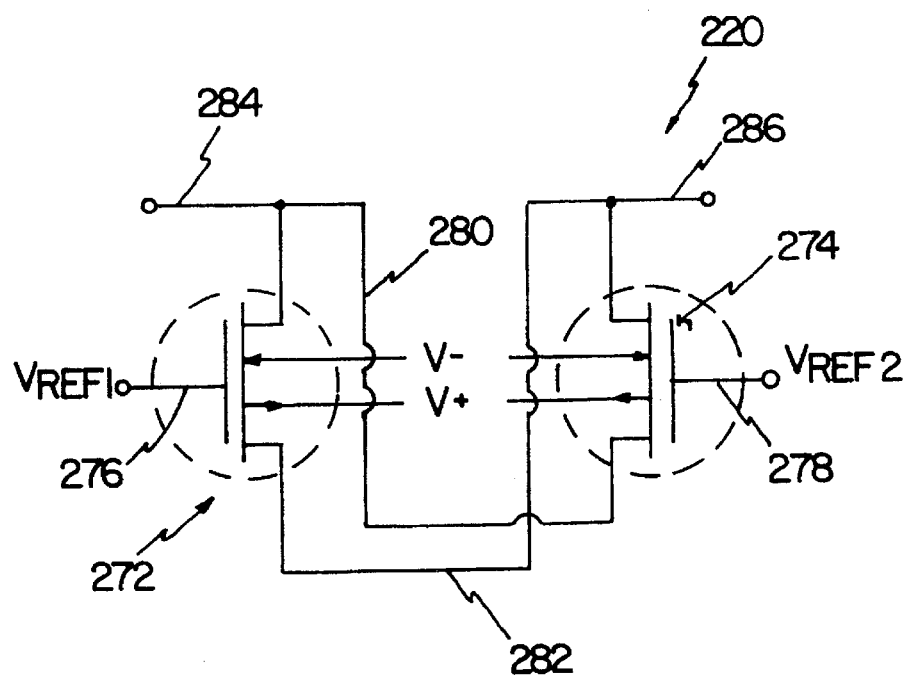
FIG. 12 is a flip-flop circuit using two switching devices of the present invention.

FIG. 12 illustrates a bistable flip-flop 270 formed from two switching devices 272 and 274 of the present invention. As described above, the switching devices 272 and 274 have a narrow dead band similar to that as shown in FIGS. 3 or 5–7 and physical construction as that of FIGS. 2, 8 and 9. Biasing voltages $V^+$ and $V^-$ are provided to the drains, as illustrated, to the inner terminals, or alternatively, to the outer terminals, if such biasing is desired. Each of the gate terminals 276 and 278 receive a reference voltage $V_{Ref\,1}$ and $V_{Ref\,2}$, respectively, to create either the N-type conductivity channel or the P-type conductivity channel. The switching devices 274 and 276 are connected together wherein signal lines 280 and 282 interconnect the devices. An input terminal 284 is connected to signal line 280, while an output terminal 286 is connected to signal line 282. As illustrated, it can be seen that the output terminal 286 can be selectively connected to the negative bias voltage $V^-$ through the P-type conductivity channel formed in the switching device 272 or alternatively, to the positive bias voltage $V^+$ through the N-type conductivity channel of switching device 274. The inverter of FIG. 11 and the flip-flop of FIG. 12 are usually compatible with CMOS logic circuits. Resistance may need to be added to obtain suitable impedance values.

Figure 13:
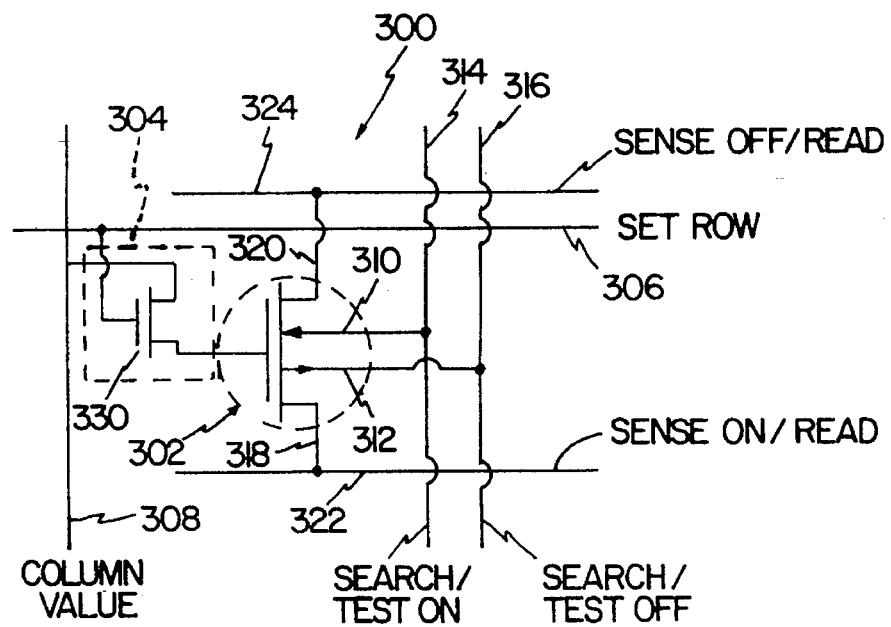
FIG. 13 is a memory cell circuit using a switching device of the present invention.

The switching device of the present invention is particularly well suited for creation of a memory cell. Referring to FIG. 13, a content-addressable memory cell 300 is illustrated. The cell 300 includes a switching device 302 of the present invention and a state control element 304 of this embodiment connected to the gate of the switching device. The state control element 304 is connected to control lines 306 and 308 identified as SET ROW and COLUMN VALUE, respectively, which are used to store a bit value in the memory cell 300. The state control element 304 receives suitable input signals from signal lines 306 and 308 to write a bit value in the memory cell by charging the gate which forms either an N-type conductivity channel or a P-type conductivity channel. Preferably, the switching device has a transconductance characteristic curve similar to FIG. 4 wherein a large dead band is provided between formation of either conductivity channel.

The content-addressable memory cell 300, being connected to similar cells to form binary words, functions similar to known content-addressable memory cells wherein each memory cell corresponding to a particular bit in a particular word is searched in parallel with all corresponding bits in other words to determine whether the search bit pattern or word is contained or stored in the array of memory. As illustrated, the memory cell 300 is connected to common pair of signal lines 314 and 316, identified as SEARCH/TEST ON and SEARCH/TEST OFF, respectively, with terminal connections 310 and 312, respectively. The signal lines 314 and 316 connect in parallel all memory cells of the array which correspond to a particular bit position.

Terminal connections 318 and 320 connect the memory cell to signal lines 322 and 324, respectively, identified as SENSE ON/READ and SENSE OFF/READ, respectively. The sense lines 322 and 324 are each connected in parallel to all memory cells forming a particular word and to suitable sense amplifiers, not shown. Current flowing in the sense lines 322 or 324 corresponds to a failure to match between a search bit pattern and the bit pattern stored in a particular word, or as illustrated, a failure to match between the bit stored in memory cell 300 and the search bit pattern on search lines 314 and 316.

For instance, assuming the state control element 304 has biased the gate of device 302 to provide a P-type conductivity channel between terminals 310 and 318 with no conductivity channel formed between terminals 312 and 320, which represents a binary logic "1". Then, if search lines 314 and 316 were biased during a search for a binary logic "0", an electrical connection will exist between bit line 314 to sense line 322 through the switching device 302. Thus, if current is present on signal line 314 current will be detected through the sense amplifier, not shown, via sense line 322 with no current sensed on sense line 324. This condition corresponds to a "don't match" between the memory cell 300 and the bit search pattern. In contrast, if the memory cell was biased with a binary logic "0" (a N-type conductivity channel formed between terminals 312 and 320 with no channel formed between terminals 310 and 318) and the search bit pattern was for a binary logic "0", no current would be sensed by the sense amplifiers for either sense line 322 or 324. This condition would indicate a match does exist between the search bit pattern and the memory cell. In summary, if current is sensed on either lines 322 or 324 during a search by biasing lines 314 and 316, the bit stored in memory does not match the search pattern. Whereas, if current is not sensed on lines 322 and 324 during a search, then the bit stored in memory corresponds to the bit search pattern.

As stated above, the memory cell 300 is connected to adjacent cells with lines 322 and 324 to form binary words. The binary value of a given word can also be determined using lines 314, 316, 322 and 324. By applying test currents to lines 322 and 324, each memory cell for a particular word is simultaneously interrogated. The resulting current transferred to lines 314 and 316 through the one of the conductive channels formed in the memory cell by the charge stored on the gate corresponds to the value of a particular bit in the word. Power usage can be reduced by supplying the current in a limited pulse by precharging appropriate lines.

Preferably, the switching device 302 has the transconductance curve of FIG. 4 wherein a wide dead band is present such that the switching device 302 can be biased to not form either of the channels representing a "don't care" function. In the embodiment illustrated, the state control element 304 comprises a suitable field-effect transistor 330. Other state control devices such as charged gate, floating gate, as part of a flip-flop, non-volatile gate, or any other suitable control devices could also be used.

Figure 14:
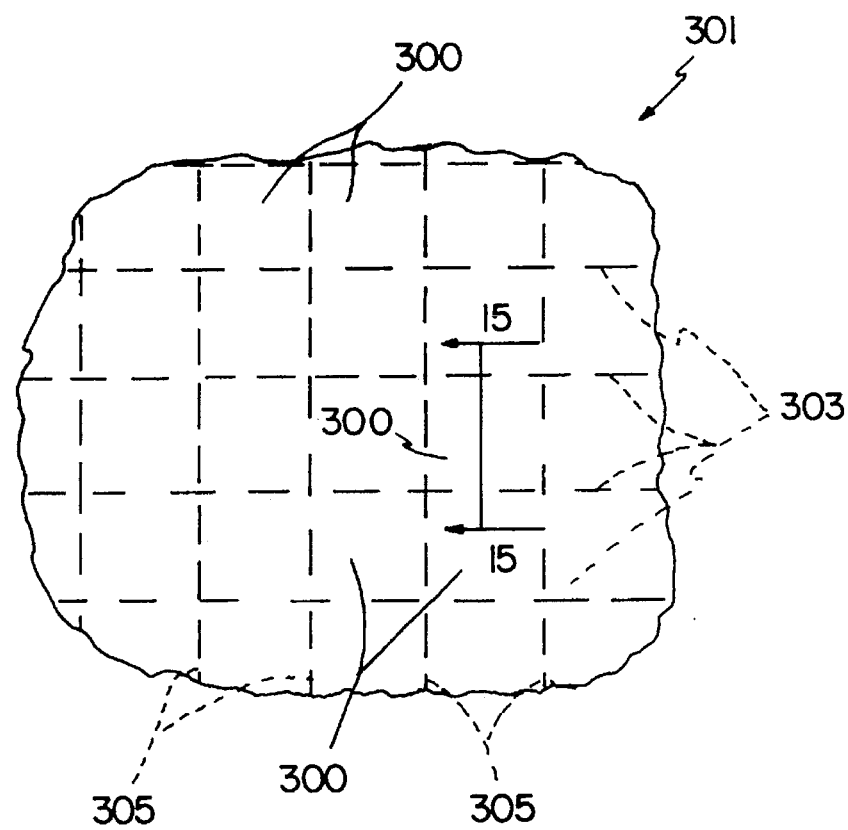
FIG. 14 is a schematic top plan view of an array of memory cells.

A schematic physical layout for an array of memory cells 301 is illustrated in FIG. 14. Each memory cell 300 is isolated from an adjoining memory cell using buried, overlapping row insulators 303 and column insulators 305.

Figure 15:
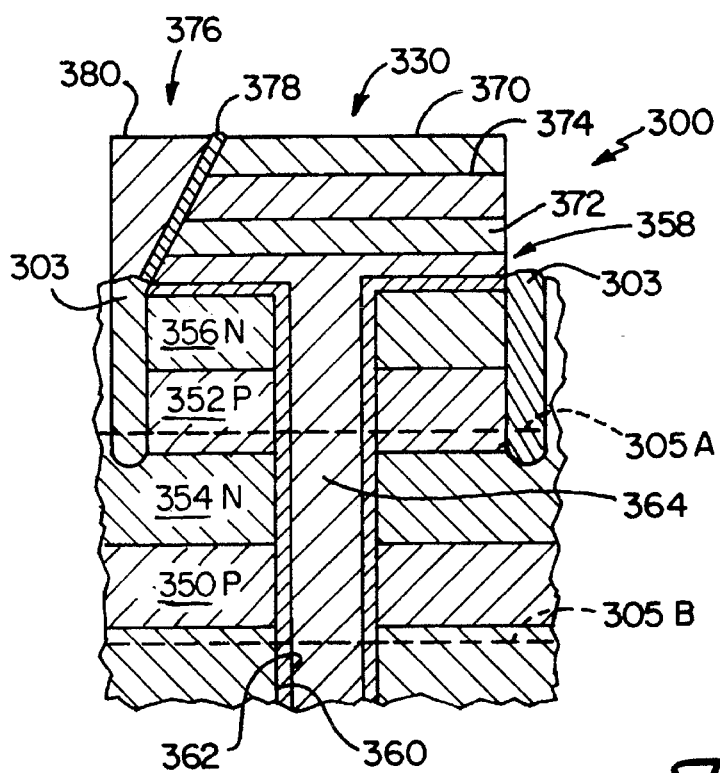
FIG. 15 is a sectional view of a memory cell taken along lines 15—15 in FIG. 14.

FIG. 15 illustrates one of the content-addressable memory cells 306 shown in FIG. 14. The memory cell 300 comprises a vertically oriented deep-well gate switching device 360, similar to the switching device 120 of FIG. 8. The field-effect transistor 330 illustrated in FIG. 13 is connected to the switching device 302. Specifically, the switching device 302 includes two semiconductor regions of P-type polarity 350 and 352, and two regions of N-type polarity 354 and 356. The gate structure 358 is formed from a well 360 through the regions 350, 352, 354 and 356. An oxide layer 362 is thermally grown or deposited in the well 360 and a p-type gate plate 364 is deposited in the well 360.

The field-effect transistor 330 is connected to the gate structure 358 using conventional techniques. As illustrated, the field-effect transistor 330 includes two regions of P-type polarity 370 and 372 and one region of N-type polarity 374. A gate structure 376 overlies the regions 370, 372 and 374 and includes a suitable insulating layer 378 and gate plate 380. The buried row insulators 303 and column insulators (illustrated with edge lines 305A and 305B) isolate the memory cell 300 from adjacent memory cells as described above. Suitable interconnecting signal lines are provided with terminal connections to the memory cell as illustrated in FIG. 13.

In summary, the present invention provides an improved semiconductor switching device. The switching device includes regions of different semiconductive material with terminals thereattached to form preferably at least two terminal pairs, each pair connected selectively through a separate conductive channel. The two conductive channels are controlled from a single input connected to a field-effect gate structure. Additional regions and gate structure can be added to provide additional channels if desired. Although the two output terminals may be connected to provide a single output, the switching device having at least two conductive paths can effectively control two circuits. Operating as a field-effect device, the present invention shifts rapidly from two opposite high conductivity states in a compact structure easily manufacturable.

Although the present invention has been described with reference to preferred embodiments, workers skilled in the art will recognize that changes may be made in form and detail without departing from the spirit and scope of the invention.

What is claimed is:

1. A semiconductor switching device comprising:

a semiconductor body having a first region of semiconductive material doped to a first polarity type adjacent a second region of semiconductive material doped to a second polarity type to form a first PN junction therebetween and a surface having a first portion of the first region adjacent a second portion of the second region, the semiconductor body having a third region of semiconductive material doped to the first polarity type adjacent the second region to form a second PN junction and a fourth region of semiconductive material doped to the second polarity type adjacent the first region to form a third PN junction;

a single gate plate spaced apart from the first portion and the second portion and extending over the first PN junction and from the second PN junction to the third PN junction, the gate plate responsive to a first control signal having a first voltage level to control formation of a first conductivity channel in the first region through the first portion of the surface to electrically connect the second and fourth regions, and responsive to a second control signal having a second voltage level to control formation of a second conductivity channel in the second region through the second portion of the surface to electrically connect the first and third regions; and wherein each of the first, second, third, and fourth regions includes an electrical contact.

2. The semiconductor switching device of claim 1 wherein the surface includes a third portion of the third region and a fourth portion of the fourth region.

3. The semiconductor switching device of claim 2 wherein the semiconductor body includes a cavity and wherein the surface is a surface portion of the cavity.

4. The semiconductor switching device of claim 1 wherein the gate plate depletes the first conductivity channel to electrically isolate the second region from the fourth region when the first voltage level of the first control signal is received.

5. The semiconductor switching device of claim 4 wherein the gate plate depletes the second conductivity channel to electrically isolate the first region from the third region when the second voltage level of the second control signal is received.

6. The semiconductor switching device of claim 5 wherein the first voltage level and the second voltage level are equal.

7. The semiconductor switching device of claim 1 wherein the first, second and fourth regions are formed in the third region.

8. The semiconductor switching device of claim 7 and further comprising an electrical insulating material located on the surface for insulating the gate plate from the surface.

9. The semiconductor switching device of claim 1 wherein the first and third regions comprise P-type doped semiconductive material and the second and fourth regions comprise N-type doped semiconductive material.

10. The semiconductor switching device of claim 1 wherein the first and third regions comprise N-type doped semiconductive material and the second and third region comprise P-type doped semiconductive material.

11. The semiconductor switching device of claim 1 wherein the first voltage level is of a first polarity and the second voltage level is of a second polarity opposite the first voltage level polarity.

12. A semiconductor memory device comprising a plurality of semiconductor switching devices, each semiconductor switching device comprising:

a semiconductor body having a first region of semiconductive material doped to a first polarity type adjacent a second region of semiconductive material doped to a second polarity type to form a first PN junction therebetween and a surface having a first portion of the first region adjacent a second portion of the second region, the semiconductor body having a third region of semiconductive material doped to the first polarity type adjacent the second region to form a second PN junction and a fourth region of semiconductive material doped to the second polarity type adjacent the first region to form a third PN junction;

a single gate plate spaced apart from the first portion and the second portion and extending over the first PN junction from the second PN junction to the third PN junction, the gate plate responsive to a first control signal having a first voltage level to control formation of a first conductivity channel in the first region through the first portion of the surface to electrically connect the second and fourth regions, and responsive to a second control signal having a second voltage level to control formation of a second conductivity channel in the second region through the second portion of the surface to electrically connect the first and third regions; and wherein each of the first, second, third, and fourth regions includes an electrical contact.

13. A semiconductor inverter comprising:

a semiconductor body having a first region of semiconductive material doped to a first polarity type adjacent a second region of semiconductive material doped to a second polarity type to form a first PN junction therebetween and a surface having a first portion of the first region adjacent a second portion of the second region, the semiconductor body having a third region of semiconductive material doped to the first polarity type adjacent the second region to form a second PN junction and a fourth region of semiconductive material doped to the second polarity type adjacent the first region to form a third PN junction;

a single gate plate spaced apart from the first portion and the second portion and extending over the first PN junction and from the second PN junction to the third PN junction, the gate plate responsive to a first control signal having a first voltage level to control formation of a first conductivity channel in the first region through the first portion of the surface to electrically connect the second and fourth regions, and responsive to a second control signal having a second voltage level to control formation of a second conductivity channel in the second region through the second portion of the surface to electrically connect the first and third regions; and wherein each of the first, second, third, and fourth regions includes an electrical contact.

14. A semiconductor flip-flop comprising:

a semiconductor body having a first region of semiconductive material of a first polarity type adjacent a second region of semiconductive material of a second polarity type to form first PN junction therebetween and a surface having a first portion of the first region adjacent a second portion of the second region, the semiconductor body having a third region of semiconductive material doped to the first polarity type adjacent the second region to form a second PN junction and a fourth region of semiconductive material doped to the second polarity type adjacent the first region to form a third PN junction;

a single gate plate spaced apart from the first portion and the second portion and extending over the first PN junction and from the second PN junction to the third PN junction, the gate plate responsive to a first control signal having a first voltage level to control formation of a first conductivity channel in the first region through the first portion of the surface to electrically connect the second and fourth regions, and responsive to a second control signal having a second voltage level to control formation of a second conductivity channel in the second region through the second portion of the surface to electrically connect the first and third regions; and wherein each of the first, second, third, and fourth regions includes an electrical contact.

15. The semiconductor memory device of claim 12 wherein the surface includes a third portion of the third region and a fourth portion of the fourth region.

16. The semiconductor memory device of claim 15 wherein the semiconductor body includes a cavity and wherein the surface is a surface portion of the cavity.

17. The semiconductor inverter of claim 13 wherein the surface includes a third portion of the third region and a fourth portion of the fourth region.

18. The semiconductor inverter of claim 17 wherein the semiconductor body includes a cavity and wherein the surface is surface portion of the cavity.

19. The semiconductor flip-flop of claim 14 wherein the surface includes a third portion of the third region and a fourth portion of the fourth region.

20. The semiconductor flip-flop of claim 19 wherein the semiconductor body includes a cavity and wherein the surface is a surface portion of the cavity.

* * * * *